United States Patent
Vosoughi et al.

(10) Patent No.: US 10,798,389 B2
(45) Date of Patent: Oct. 6, 2020

(54) METHOD AND APPARATUS FOR CONTENT-AWARE POINT CLOUD COMPRESSION USING HEVC TILES

(71) Applicant: Tencent America LLC, Palo Alto, CA (US)

(72) Inventors: Arash Vosoughi, San Jose, CA (US); Sehoon Yea, Palo Alto, CA (US); Shan Liu, Palo Alto, CA (US)

(73) Assignee: Tencent America LLC, Palo Alto, CA (US)

( * ) Notice: Subject to any disclaimer, the term of this patent is extended or adjusted under 35 U.S.C. 154(b) by 0 days.

(21) Appl. No.: 16/568,002

(22) Filed: Sep. 11, 2019

(65) Prior Publication Data

US 2020/0107028 A1  Apr. 2, 2020

Related U.S. Application Data

(60) Provisional application No. 62/740,299, filed on Oct. 2, 2018, provisional application No. 62/775,879, filed on Dec. 5, 2018.

(51) Int. Cl.
  *H04N 19/167* (2014.01)
  *H04N 19/597* (2014.01)
  (Continued)

(52) U.S. Cl.
  CPC ............ *H04N 19/167* (2014.11); *G06T 7/11* (2017.01); *H03M 7/3059* (2013.01);
  (Continued)

(58) Field of Classification Search
  CPC .... H04N 19/167; H04N 19/597; H04N 19/88; H04N 19/20; H03M 7/3059; H03M 7/40;
  (Continued)

(56) References Cited

U.S. PATENT DOCUMENTS

| | | | | |
|---|---|---|---|---|
| 2004/0179609 | A1* | 9/2004 | Takahashi | H04N 19/167 375/240.25 |
| 2015/0023407 | A1* | 1/2015 | Sato | H04N 19/55 375/240.02 |

OTHER PUBLICATIONS

Mammou et al., "Point Cloud Compression: Test Model Category 2 version 0.0," ISO/IEC JTC1/SC29/WG11 m41920, Oct. 2017, Macau, China (8 pages).

(Continued)

*Primary Examiner* — Nam D Pham
(74) *Attorney, Agent, or Firm* — Oblon, McClelland, Maier & Neustadt, L.L.P.

(57) ABSTRACT

A method includes receiving a data cloud including a plurality of data points. The method further includes identifying each data point including a region-of-interest (ROI) and dividing the data cloud into a ROI cloud and one or more non-ROI clouds. The method includes performing a patch generation process on the ROI cloud, the patch generation process including generating a ROI patch from each data point including the ROI. The method includes performing a patch packing process on the ROI cloud, the patch packing process including: (i) mapping each ROI patch to a two dimensional (2D) map, (ii) determining whether at least two ROI patches from the plurality of ROI patches are located in more than one tile of the map, and (iii) in response to the determination that at least two ROI patches are located in more than one tile, moving each of the ROI patches to a tile.

20 Claims, 15 Drawing Sheets

(51) Int. Cl.
*H03M 7/30* (2006.01)
*G06T 7/11* (2017.01)

(52) U.S. Cl.
CPC .. *H04N 19/597* (2014.11); *G06T 2207/10028* (2013.01); *G06T 2207/20104* (2013.01)

(58) Field of Classification Search
CPC .................... H03M 7/3075; G06T 7/11; G06T 2207/10028; G06T 2207/20104
See application file for complete search history.

(56) References Cited

OTHER PUBLICATIONS

Mekuria et al., "Requirements for Point Cloud Compression," ISO/IEC JTC1/SC29/WG11 MPEG2016/n16330 Feb. 2016, Geneva, CH (3 pages).

Tulvan et al., "Use Cases for Point Cloud Compression (PCC)," ISO/IEC JTC1/SC29/WG11 MPEG2015/ N16331 Jun. 2016, Geneva, CH (8 pages).

\* cited by examiner

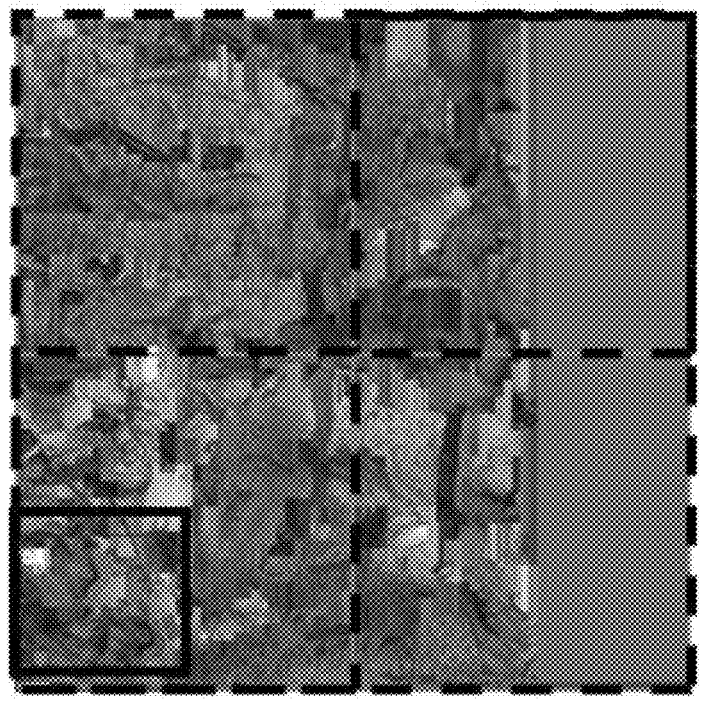
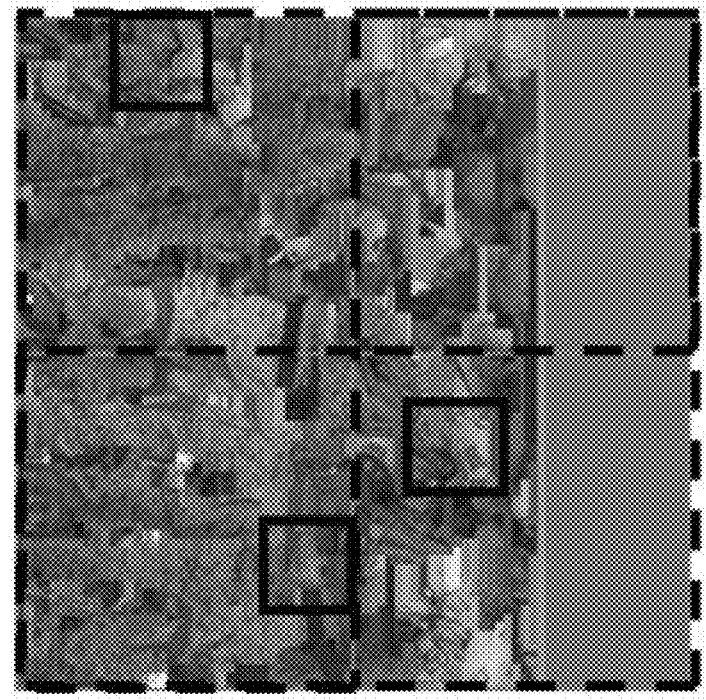
FIG. 4A
FIG. 4B

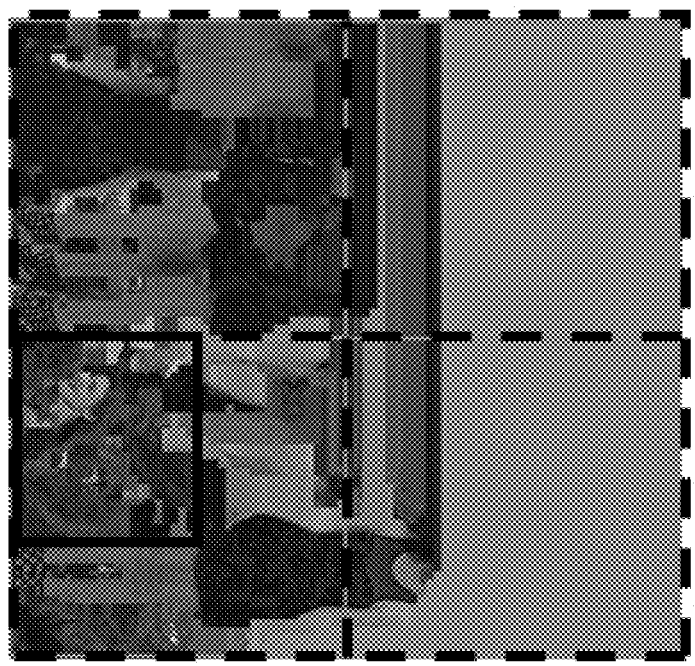
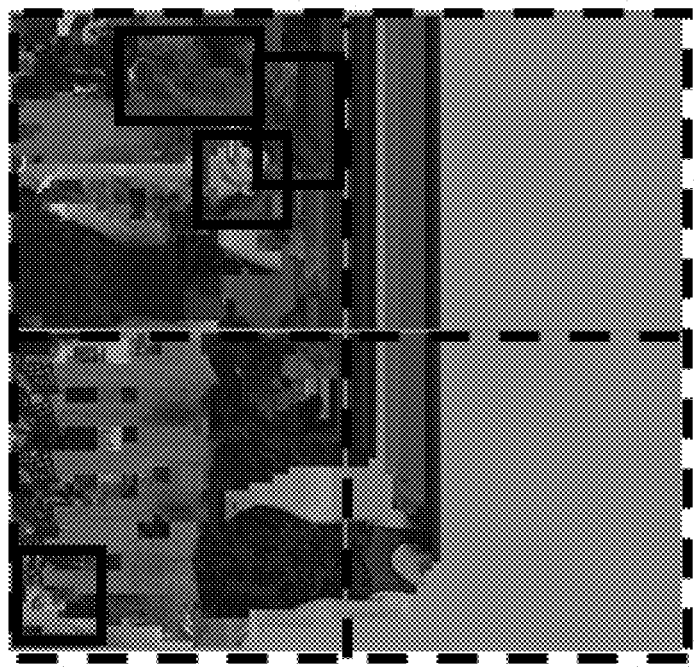
FIG. 6A
FIG. 6B

FIG. 9

METHOD AND APPARATUS FOR CONTENT-AWARE POINT CLOUD COMPRESSION USING HEVC TILES

INCORPORATION BY REFERENCE

This present disclosure claims the benefit of priority to a series of U.S. Provisional Application No. 62/740,299, filed on Oct. 2, 2018 and 62/775,879, filed Dec. 5, 2018, each of which are incorporated by reference herein in their entirety.

TECHNICAL FIELD

The present disclosure describes embodiments generally related to video coding.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Three-dimensional (3D) representations of the world are enabling more immersive forms of interaction and communication, and also allow machines to understand, interpret and navigate the world. Point clouds have emerged as one of such 3D enabling representations. The Moving Picture Experts Group (MPEG) has identified a number of use cases associated with point cloud data, and developed corresponding requirements for point cloud representation and compression.

SUMMARY

According to an exemplary embodiment, a method performed by a video encoder includes receiving a data cloud including a plurality of data points representing a three-dimensional (3D) space. The method further includes identifying each data point including a region-of-interest (ROI) associated with the data cloud. The method further includes dividing the data cloud into a ROI cloud and one or more non-ROI clouds, the ROI cloud including each data point including the ROI. The method further includes performing a patch generation process on the ROI cloud, the patch generation process including generating a ROI patch from each data point including the ROI. The method further includes performing a patch packing process on the ROI cloud, the patch packing process including: (i) mapping each ROI patch to a two dimensional (2D) map including a plurality of tiles arranged as a grid in the 2D map, (ii) determining whether at least two ROI patches from the plurality of ROI patches are located in more than one tile, and (iii) in response to the determination that at least two ROI patches are located in more than one tile, moving each of the ROI patches to a tile from the plurality of tiles.

According to an exemplary embodiment, a video encoder includes processing circuitry configured to receive a data cloud including a plurality of data points representing a three-dimensional (3D) space. The processing circuitry is further configured to identify each data point including a region-of-interest (ROI) associated with the data cloud. The processing circuitry is further configured to divide the data cloud into a ROI cloud and one or more non-ROI clouds, the ROI cloud including each data point including the ROI. The processing circuitry is further configured to perform a patch generation process on the ROI cloud, the patch generation process including generating a ROI patch from each data point including the ROI. The processing circuitry is further configured to perform a patch packing process on the ROI cloud, the patch packing process that includes: (i) map each ROI patch to a two dimensional (2D) map including a plurality of tiles arranged as a grid in the 2D map, (ii) determine whether at least two ROI patches from the plurality of ROI patches are located in more than one tile, and (iii) in response to the determination that at least two ROI patches are located in more than one tile, move each of the ROI patches to a tile from the plurality of tiles.

According to an exemplary embodiment, a non-transitory computer readable medium having instructions stored therein, which when executed by a processor in a video encoder causes the processor to perform a method. The method includes receiving a data cloud including a plurality of data points representing a three-dimensional (3D) space. The method further includes identifying each data point including a region-of-interest (ROI) associated with the data cloud. The method further includes dividing the data cloud into a ROI cloud and one or more non-ROI clouds, the ROI cloud including each data point including the ROI. The method further includes performing a patch generation process on the ROI cloud, the patch generation process including generating a ROI patch from each data point including the ROI. The method further includes performing a patch packing process on the ROI cloud, the patch packing process including: (i) mapping each ROI patch to a two dimensional (2D) map including a plurality of tiles arranged as a grid in the 2D map, (ii) determining whether at least two ROI patches from the plurality of ROI patches are located in more than one tile, and (iii) in response to the determination that at least two ROI patches are located in more than one tile, moving each of the ROI patches to a tile from the plurality of tiles.

BRIEF DESCRIPTION OF THE DRAWINGS

Further features, the nature, and various advantages of the disclosed subject matter will be more apparent from the following detailed description and the accompanying drawings in which:

FIGS. 4A and 4B shows exemplary patch packing in accordance with embodiments of the present disclosure.

FIGS. 6A and 6B shows exemplary patch packing in accordance with embodiments of the present disclosure.

FIG. 9 shows an example patch packing order in accordance with an embodiment.

DETAILED DESCRIPTION OF EMBODIMENTS

Point cloud data is used to represent a three-dimensional (3D) scene or object in some emerging applications such as immersive virtual reality (VR)/augmented reality (AR)/mixed reality (MR), automotive/robotic navigation, medical imaging, and the like. A point cloud includes a collection of individual 3D points. Each point is associated with a set of 3D coordinates indicating a 3D position of the respective point and a number of other attributes such as color, surface normal, opaque, reflectance, etc. In various embodiments, input point cloud data can be quantized and subsequently organized into a 3D grid of cubic voxels that can be described using an octree data structure. A resulting voxelized octree facilitates the traversal, search, and access of the quantized point cloud data.

Figures 1A, 1B:
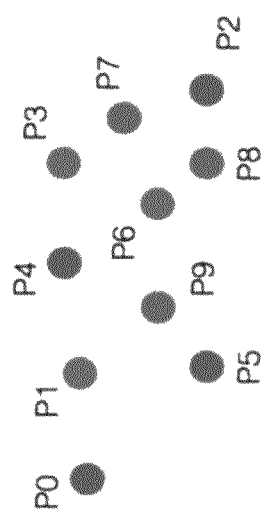
FIG. 1A shows an example point cloud.
FIG. 1B shows a recursive subdivision process in accordance with an embodiment.

A point cloud is a set of points in a 3D space, each with associated attributes, e.g. color, material properties, etc. FIG. 1A illustrates an example point cloud with points P0-P8. Point clouds can be used to reconstruct an object or a scene as a composition of such points. They can be captured using multiple cameras and depth sensors in various setups, and may be made up of thousands and even billions of points in order to realistically represent reconstructed scenes.

Compression technologies are needed to reduce the amount of data required to represent a point cloud. As such, technologies are needed for lossy compression of point clouds for use in real-time communications and six Degrees of Freedom (6 DoF) virtual reality. In addition, technologies are sought for lossless point cloud compression in the context of dynamic mapping for autonomous driving and cultural heritage applications, etc. Further, standards are needed to address compression of geometry and attributes (e.g., colors and reflectance), scalable/progressive coding, coding of sequences of point clouds captured over time, and random access to subsets of the point cloud.

FIG. 1B illustrates an example of a 2D occupancy map 110. The occupancy map may be a binary 2D image where 1's and 0's represent occupied and unoccupied pixels, respectively. Back projection may be used to reconstruct the point cloud using the 2D occupancy map 110 and the geometry video.

According to some embodiments, video codecs compress geometry, motion, and texture information of a dynamic point cloud as three separate video sequences. The extra metadata needed to interpret the three video sequences (i.e., occupancy map and auxiliary patch information) may be compressed separately. The metadata information may represent a small amount of an overall bitstream, and the metadata could be efficiently encoded/decoded by using a software implementation. The bulk of the information may be handled by the video codec.

Figure 2:
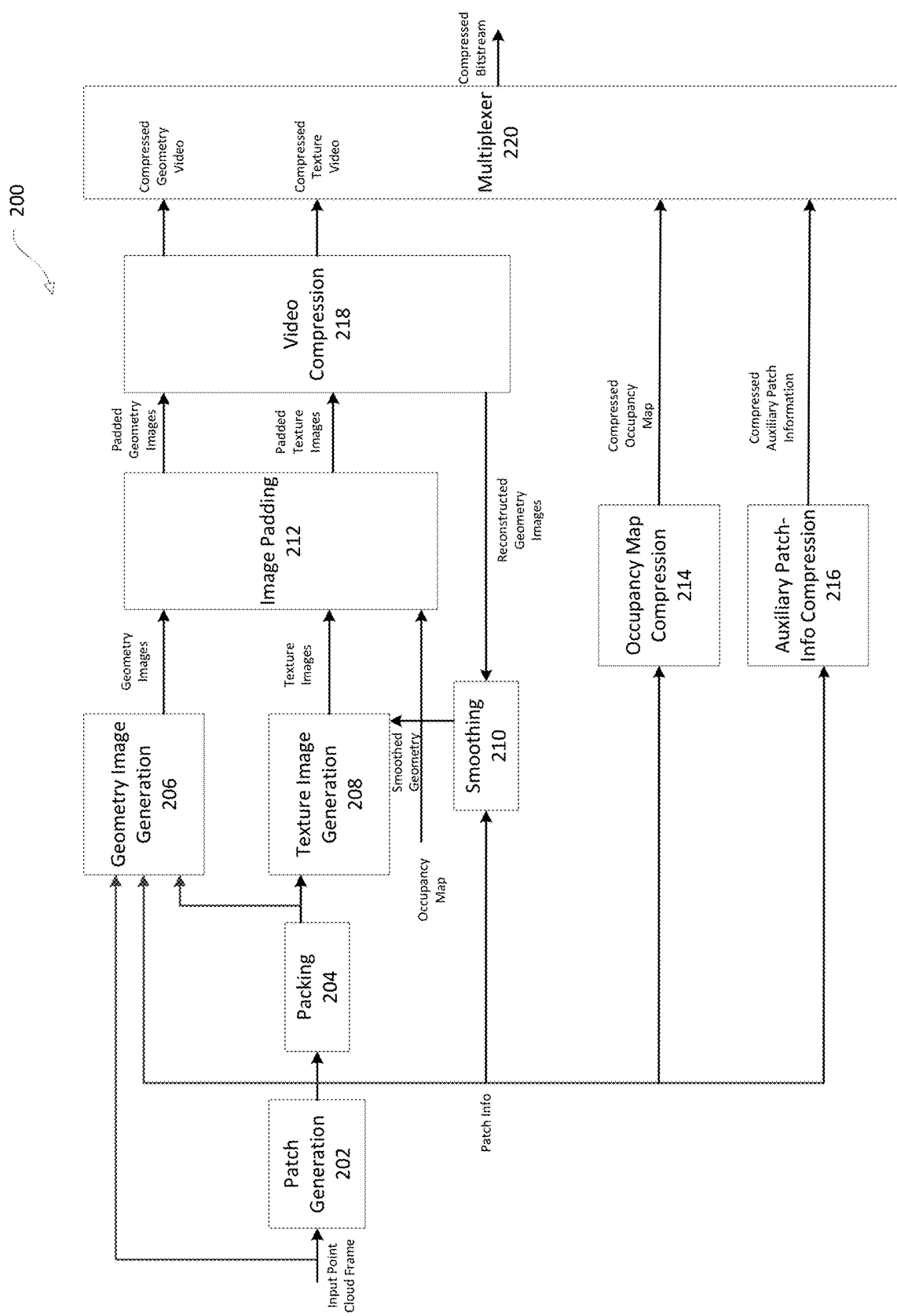
FIG. 2 shows an exemplary video codec in accordance with an embodiment.

FIG. 2 illustrates an embodiment of a video codec 200. A point cloud frame is inputted into a patch generation unit 202 to generate patches from the point cloud frame. After the patch generation is performed, a packing unit 204 receives the output from the patch generation unit 202 to perform a packing process on the patches. The output of the packing unit 204 is fed into texture image generation unit 208. The texture image generation unit 208 receives smoothed geometry from smoothing unit 210 and outputs texture images to image padding 212. For example, geometry is first reconstructed using the decompressed geometry video and decompressed occupancy map. Geometry smoothing is applied on the resulting cloud to alleviate distortion due to video codec compression artifacts at patch boundaries. Geometry image generation unit 206 receives inputs from the point cloud frame, patch info, and the output of the packing unit 204. The patch info may include information such as patch origin along with a shift with respect to an origin of the image, patch size, etc. Geometry image generation 206 outputs geometry images to image padding unit 212. The image padding unit 212 further receives an occupancy map. Image padding unit 212 outputs padded geometry images and padded texture images to video compression unit 218. Video compression unit 218 outputs compressed geometry video and compressed texture video to multiplexer 220. The video compression unit 218 further feeds back reconstructed geometry images to smoothing unit 210. Occupancy map compression unit 214 receives patch info, and outputs a compressed occupancy map to multiplexer 220. Auxiliary patch info compression 216 receives patch info and outputs compressed auxiliary patch information to multiplexer 220. The multiplexer 220 outputs a compressed bitstream.

According to some embodiments, a patch generation process decomposes a point cloud into a minimum number of patches with smooth boundaries, while also minimizing a reconstruction error. Encoders may implement various methods to generate this type of decomposition.

Figure 3:
FIG. 3 shows an example of mapping of patches onto a two-dimensional (2D) grid.

According to some embodiments, a packing process maps the patches onto a 2D grid, as illustrated in FIG. 3, while minimizing unused space, and guaranteeing that every M×M (e.g., 16×16) block of the grid is associated with a unique patch. M may be an encoder defined parameter that is encoded in a bitstream and sent to the decoder. In FIG. 3, patches may be readily distinguished from the background. In some examples, the occupancy map is a binary image with exactly the same dimensions as the image in FIG. 3, where any pixel that belongs to a patch is set to 1, and any pixel that belongs to the background is set to 0. The aforementioned occupancy map may be full-resolution map. However, for lossy compression, the full-resolution occupancy map may be down-sampled and then compressed. At the decoder, the occupancy map may be decompressed and up-sampled back to the original full-resolution. For lossless compression, however, the occupancy map is coded with the original full-resolution format.

Certain models use a packing strategy that iteratively tries to insert patches into a w×h grid. w and h may be user defined parameters, which correspond to the resolution of the geometry/texture/motion of video images to be encoded. The patch location may be determined through an exhaustive search that is applied in a raster scan order. The first location that can guarantee an overlapping-free insertion of the patch may be selected and the grid cells covered by the patch are marked as used. If no empty space in the current resolution image can fit a patch, then the height h of the grid may be temporarily doubled, and the search is performed again. At the end of the process, h may be clipped to fit the used grid cells. For a video sequence, a process that determines w and h for the entire GOP may be used.

Furthermore, certain models segment an input cloud into several patches and packs those patches into two 2D images (geometry and attributes), and subsequently compresses those images using High Efficiency Video Coding (HEVC). Given a specification of region of interest (ROI) in the form of a 3D bounding box, a content-aware point cloud compression system is desired to fulfill the below features:

1. The ROI is coded with a higher quality than other parts of the point-cloud.
2. The ROI is coded independently from other parts of the point-cloud to facilitate spatial random-access without full-decoding.
3. The independent coding of ROI needs to be harmonized with any system requirements regarding independent (parallel) encoding/decoding.
4. Multiple ROIs need to be supported.

Embodiments of the present disclosure use HEVC tiles to realize content-aware point cloud compression to provide the above desired features. Embodiments of the present disclosure provide the significantly advantageous feature of running only one instance of a compression model without having to enlarge the size of a packed image.

According to some embodiments, content-aware coding is achieved by using HEVC tiles, where a given 3D ROI is projected into one (or more) tile, and that tile is coded with a higher quality. One problem with current compression models is that there is no guarantee that the 3D ROI is projected into neighboring locations. In this regard, a projection of a given ROI spans more than one tile although it is possible to completely fit the ROI in a single tile. In a content-aware video compression system, when this situation occurs, a lower QP is chosen for more than a single tile, which leads to a performance degradation given a limited bit rate budget.

In some embodiments, to exploit HEVC tiles for efficient content-aware point cloud compression, a given 3D ROI is fitted into as few HEVC tiles as possible. A tiling map may be provided a priori (e.g., 2×2 tiling map). A ROI may be fitted into a tile (or tiles) with higher priority (or priorities). Patches may be packed into a 2D grid after they are ordered with respect to their size.

In some embodiments, the patches that intersect with a given ROI specified by a 3D bounding box are found. This results in two sets of patches: the ones that intersect with the ROI (e.g., ROI patches), and the ones that do not intersect with the ROI. The ROI patches and non-ROI patches may be packed according to their sizes. For example, a first ROI patch that is larger than a second ROI patch may be given higher priority and thus, packed before the second ROI patch to use the available space more efficiently. A condition that a 2D bounding box of an ROI patch does not extend to neighboring tiles may be specified.

Figure 5B:
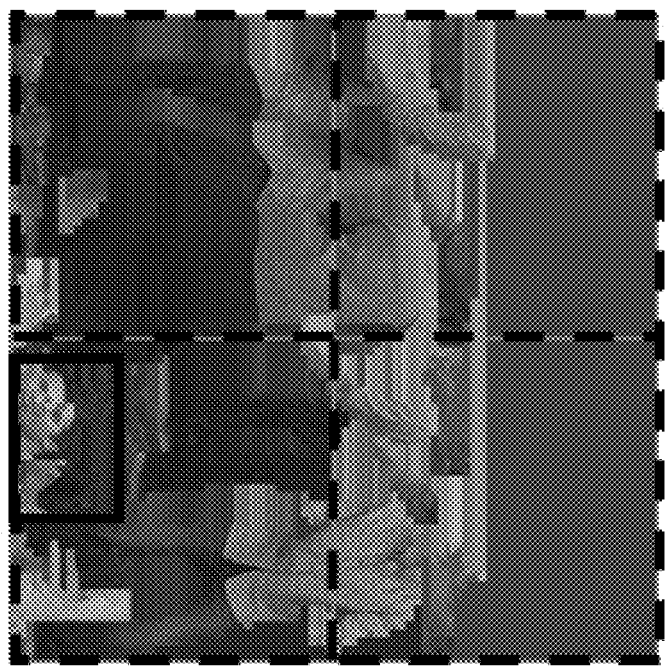
FIGS. 5A and 5B shows exemplary patch packing in accordance with embodiments of the present disclosure.
Figure 5A:
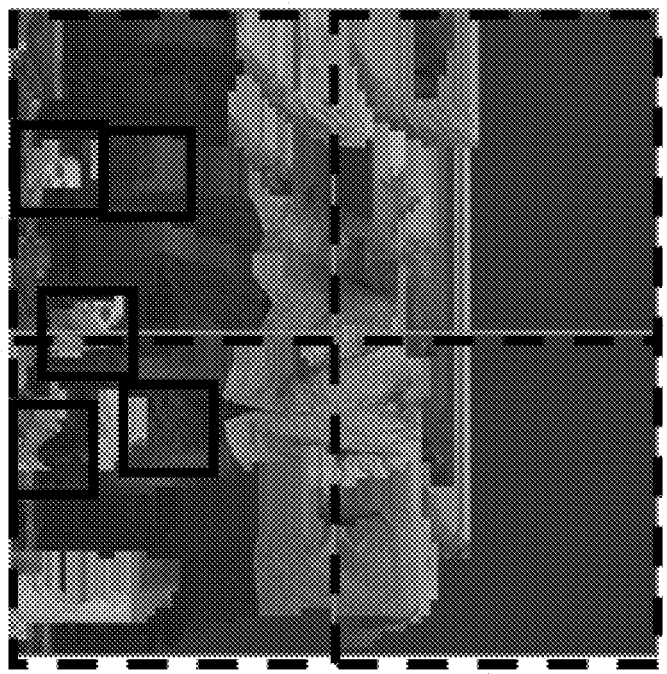

FIG. 4A illustrates an example patch packing for a "soldier" picture. The boundary of each tile is depicted by a dashed line. Furthermore, each patch is bounded by a 2D bounding box depicted by a solid black line. Here, a ROI may be selected as the head of the soldier. As illustrated in FIG. 4A, there are three ROIs that are each bounded by a 2D box, and span three different tiles. FIGS. 5A and 6A illustrate other examples in which ROI patches span more than one tile after packing.

According to some embodiments, the ROI and the rest of the points are each regarded as a separate point cloud. For example, a point cloud is separated into a ROI cloud and a non-ROI cloud. The ROI cloud includes points in the point could that include the ROI. The non-ROI cloud includes points in the point cloud that do not include the ROI. The ROI cloud and non-ROI cloud independently undergo the patch generation process to generate ROI patches and non-ROI patches, respectively. After the patch generation process, the ROI patches are fitted into as few tiles as possible. After the ROI patches are mapped, the non-ROI patches are mapped to the 2D grid. FIGS. 4B, 5B, and 6B illustrate the resulting 2D grid after the packing process is performed on ROI and non-ROI patches that were generated from separate ROI and non-ROI clouds, respectively. As illustrated in FIGS. 4B, 5B, and 6B, the ROI patches are grouped together (i.e., placed) into a single tile, which leads to more efficient compression since the tiles that do not contain the ROI patches may be compressed with a lower rate (lower quality) to save more bits for the tile that contains the ROI patches.

Figure 7:
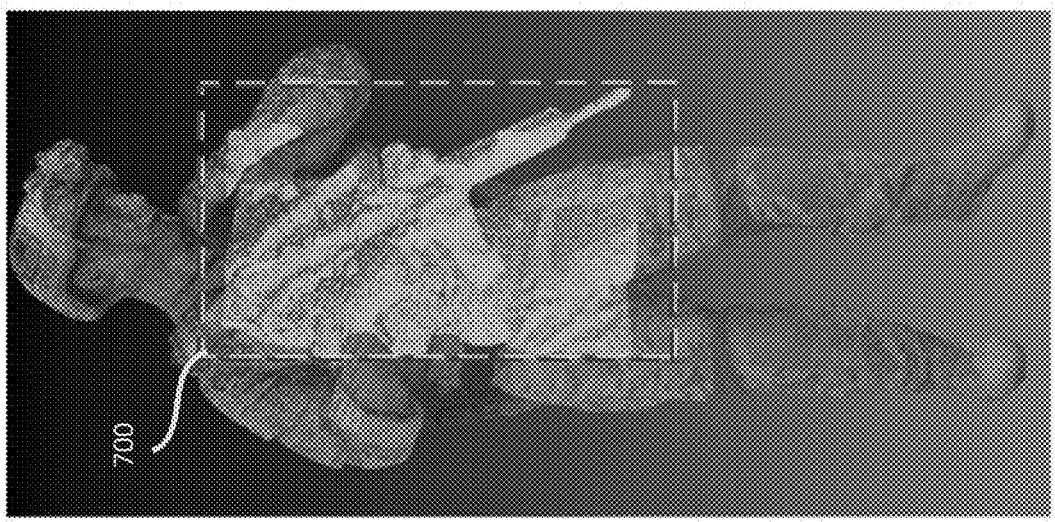
FIG. 7 shows an example three dimensional (3D) ROI in accordance with an embodiment.
Figure 8B:
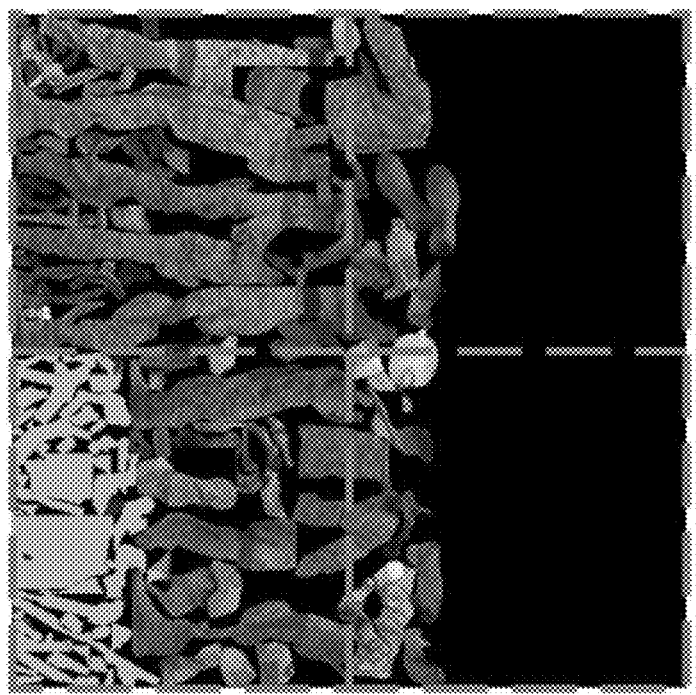
FIGS. 8A and 8B shows exemplary patch packing in accordance with embodiments of the present disclosure.
Figure 8A:
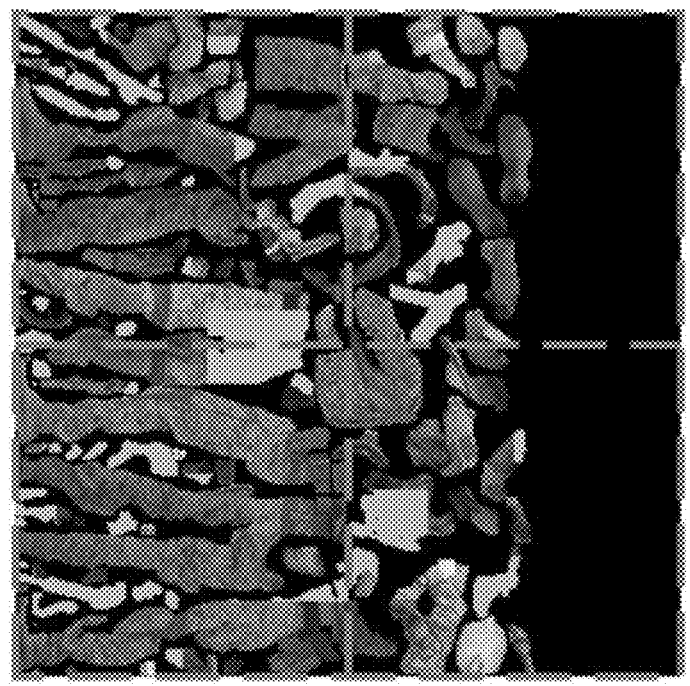

According to some embodiments, a point cloud includes a single ROI and has a tile map specified a priori by a system requirement. A V-PCC anchor patch generation process and packing scheme typically project a given 3D ROI all over the 2D grid in a projected image. This behavior of the anchor patch generation and packing does not allow for efficient use of HEVC tiles. For example, FIG. 7 illustrates a point cloud where the ROI is colored in light gray (i.e., area within box 700). FIG. 8A illustrates a resulting packed image in which a ROI cloud is not separated from a non-ROI cloud, and FIG. 8B illustrates a resulting packed image in which the ROI cloud is separated from the non-ROI cloud. As illustrated in FIG. 8A, the projected ROI is scattered all over the 2D grid, whereas in FIG. 8B, the projected ROI is placed into a single tile.

In some embodiments, a point cloud is separated into a ROI cloud and a non-ROI cloud. The ROI cloud includes all the ROI points in the point cloud. The non-ROI cloud includes all the non-ROI points in the point cloud. The patches for the ROI cloud and non-ROI cloud may be generated independently, which provides the significantly advantageous feature of guaranteeing that any single patch entirely belongs either to the ROI cloud or the non-ROI cloud. Accordingly, when the patch generation process is performed independently on the ROI cloud and the non-ROI cloud, two sets of patches are produced: (1) a set of ROI patches, where all the points of any ROI patch belong to the ROI cloud, and (2) a set of non-ROI patches, where all the points of any non-ROI patch belong to the non-ROI cloud.

Table 1 illustrates an example patch process.

TABLE 1

| | Descriptor |
| --- | --- |
| Roi_patch_metadata( ) { | |
|   if(roi_patch_metadata_enabled_flag) { | |
|     roi_patch_metadata_present_flag | u(1) |
|     if(roi_patch_metadata_present_flag) { | |
|       for(r= 0; r < number_of_rois; ++r) { | |
|         number_of_roi_patches[ r ] | u(32) |
|       } | |
|     } | |
|   } | | roi_patch_metadata_enabled_flag indicates whether ROI patches are enabled. This flag is used to indicate that a point cloud has been separated into a separate ROI cloud and a non-ROI cloud.

roi_patch_metadata_present_flag indicates whether any ROI (single or multiple) is present or not.

number_of_roi_patches[r] indicates the number of patches belonging to the r-th ROI. The value of number_of_roi_patches[r] shall be in range of 1 to $2^{32}-1$, inclusive.

Figure 9:
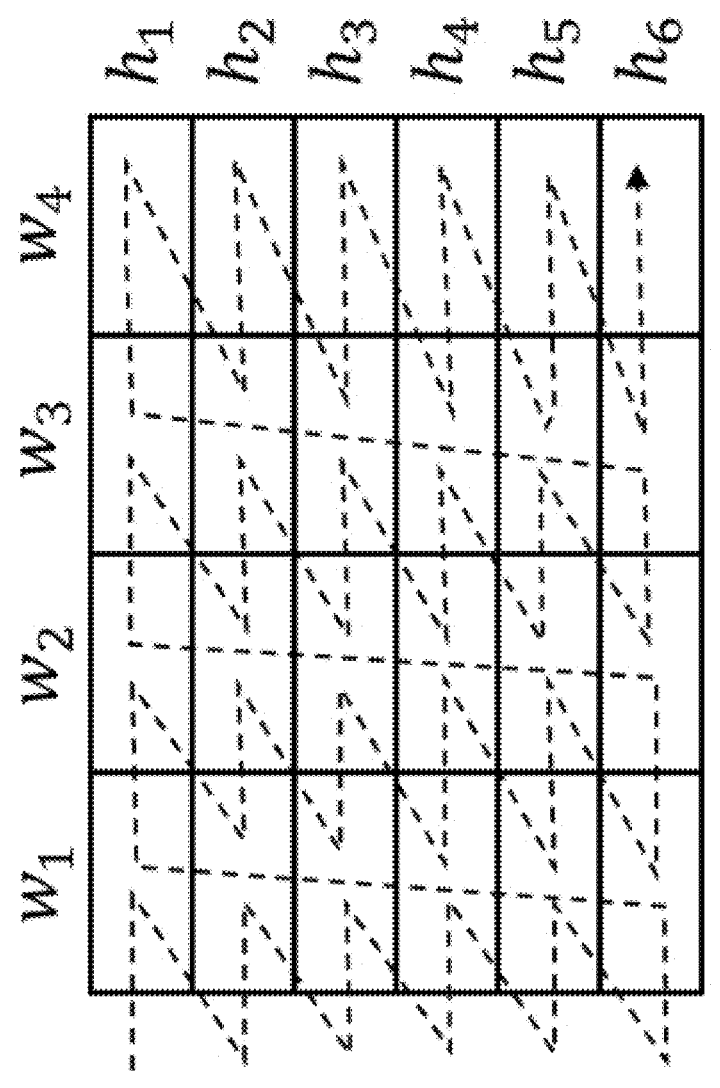

According to some embodiments, based on a tile map specified by the system, ROI patches are packed into as few tiles as possible. An example tile map may have a size W×H where there are H rows and W columns of tiles, respectively. The H rows may be set as TileRowHeightArray={$h_1, h_2$, R1, $h_H$}, and the W columns may be set as TileColumnWidthArray=$w_1, w_2$, R1, $w_W$ (see FIG. 9). FIG. 9 illustrates a proposed patch packing order (i.e., dashed line) when a tile map is specified by the system. As illustrated in FIG. 9, a 4×6 tile map example is illustrated where W=4 and H=6. This patch packing order remains the same for the case of multiple ROIs. This patch packing order may remain the same when a point cloud has multiple ROIs. For multiple ROIs, Based on a tile map, the ROI and non-ROI patches may be packed onto the tile map in accordance with the process illustrated in FIG. 10. The process illustrated in FIG. 10 may be performed by video codec 200. The process may start at step S1000 where an input cloud of p points and an ROI specified by a 3D bounding box is specified. The point cloud of p points may be separated into a ROI cloud and a non-ROI cloud. The process proceeds to step S1002 where a number of ROI patches are generated. The ROI patches may be generated in accordance with the process illustrated in Table 1. The process proceeds to step S1004 where a number of non-ROI patches are generated. In this regard, steps S1002 and S1004 result in the independent generation of ROI and non-ROI patches.

The process proceeds from step S1004 to step S1006 where a variable k is set to 0. The process proceeds to step S1008 where the variable k is incremented by 1. The process proceeds to step S1010 where the kth ROI patch is packed with respect to an order as illustrated in FIG. 9. The process proceeds to step S1012 where it is determined if k is equal to the number of ROI patches. If k is not equal to the number of ROI patches, the process returns from step 1012 to step 1008. Accordingly, steps S1006 to S1012 result in the packing of each ROI patch.

Figure 10:
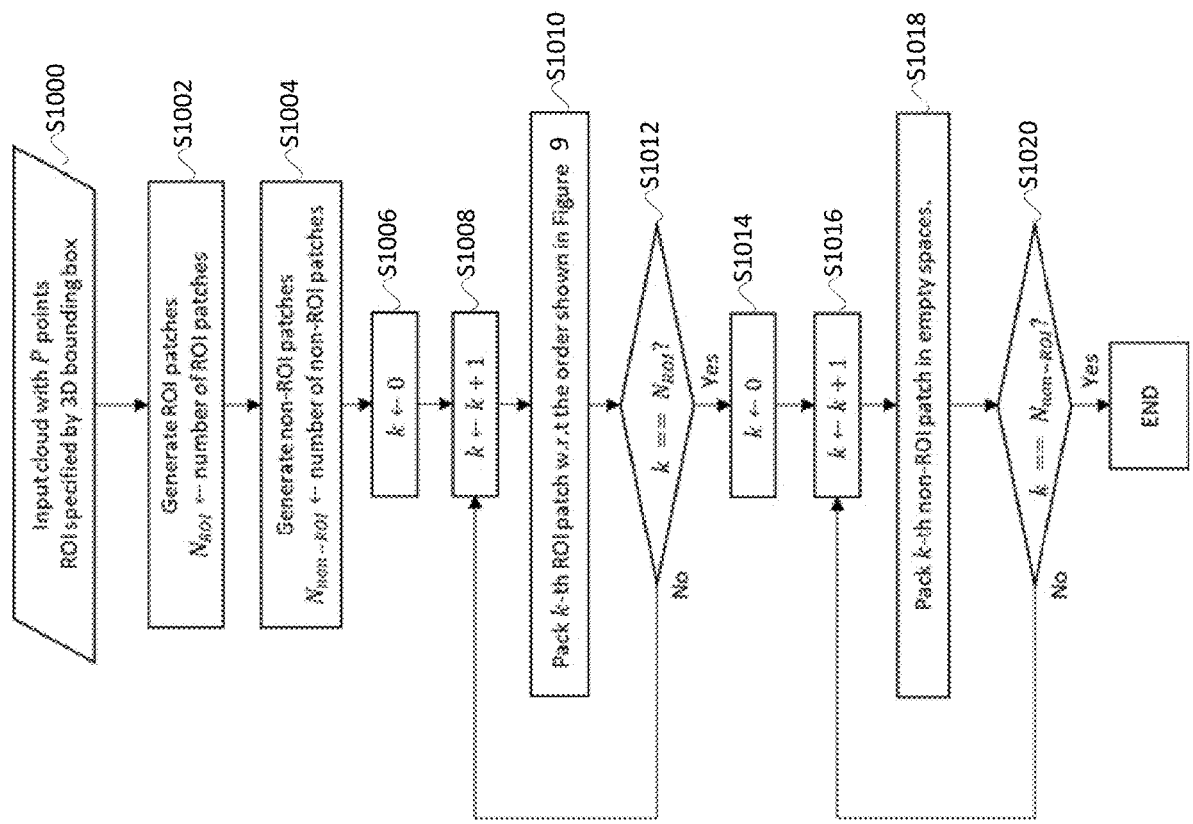
FIG. 10 show an exemplary process performed by a video codec in accordance with an embodiment.

If k is equal to the number of ROI patches, the process proceeds to step S1014 where k is set to 0. The process proceeds to step S1016 where k is incremented by 1. The process proceeds to step S1018 where the kth non-ROI patch is packed into an empty space. The process proceeds to step S1020 where it is determined if k is equal to the number of non-ROI patches. If k is not equal to the number of non-ROI patches, the process returns from step S1020 to step S1016. Accordingly, steps S1014 to S1020 result in the packing of each non-ROI patch. If k is equal to the number of non-ROI patches, the process illustrated in FIG. 10 ends. Although the process illustrated in FIG. 10 is performed for a single ROI, when a point cloud has multiple ROIs, steps S1002-S1012 may be performed for each ROI included in the point cloud.

According to some embodiments, the ROI cloud is divided into several smaller sub-clouds, which may be referred to as chunks. For example, when it is determined that a ROI cloud is bigger than a tile, the ROI cloud is divided into smaller chunks. In some embodiments, a patch generation process is independently performed on each chunk. Chunking generates smaller ROI patches, which provides improved packing so that more spaces in the 2D grid are filled by the projected ROI cloud.

In some embodiments, dividing the ROI cloud into chunks is based on finding eigenvectors of the ROI cloud and performing chunking along the axes corresponding to the eigenvectors. In another embodiment, chunking is performed based on finding a bounding box of the ROI points in the ROI cloud, and finding the longest axis of that bounding box, where chunking may be performed along the longest axis. For example, referring to FIG. 1B, the chunking may be performed in a direction along the longest axis of the bounding box. In another embodiment, the chunking may be performed along one, two, or all three axes of the bounding box. Chunking may be performed uniformly or non-uniformly based on criteria, for example, a local density of points. For example, an area of the ROI cloud having a higher density of points may be divided into smaller chunks compared to an area of the ROI cloud with a lower density of points. Furthermore or more of the above embodiments may be combined. For example, chunking may be performed along the longest axis of the bounding box either uniformly or non-uniformly based on certain criteria.

Figure 11:
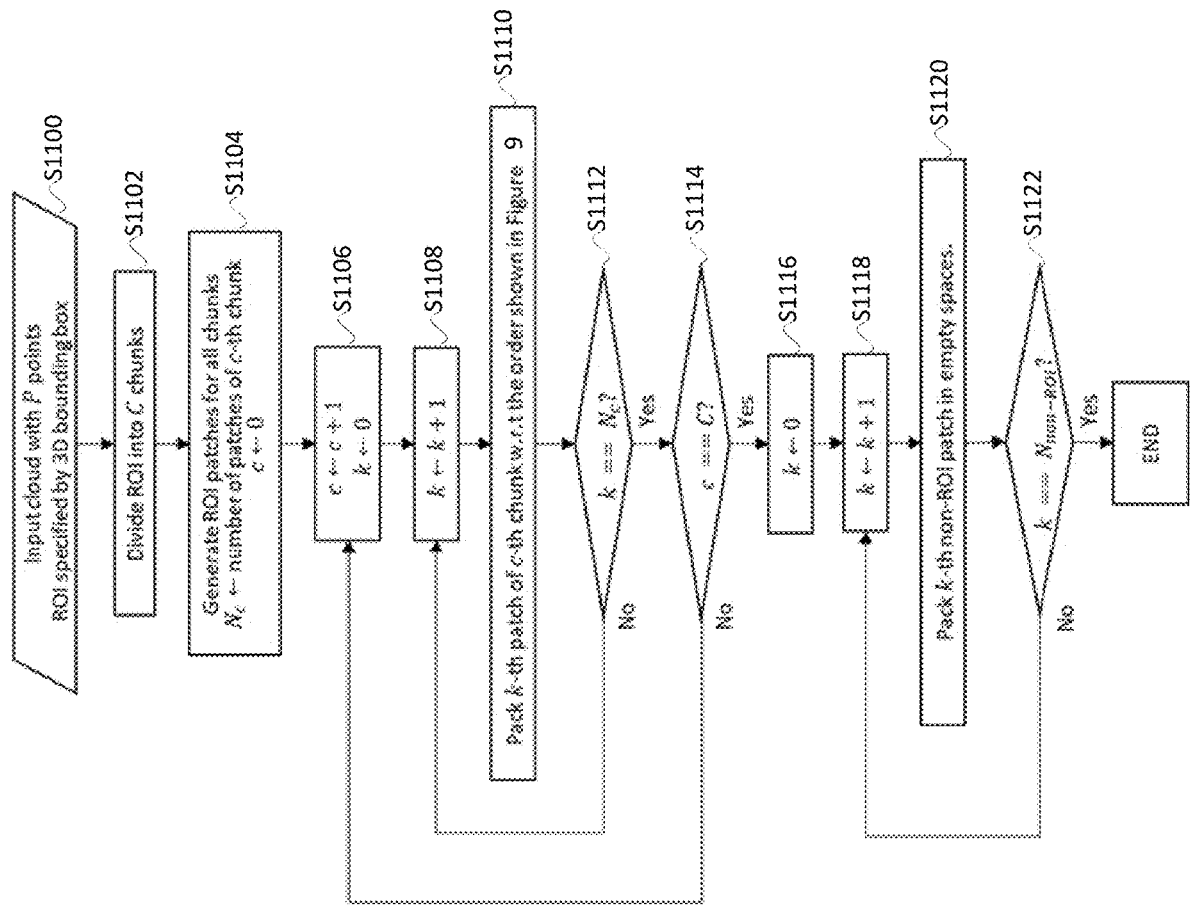
FIG. 11 show an exemplary process performed by a video codec in accordance with an embodiment.

FIG. 11 illustrates an embodiment of a process of performing packing on a ROI cloud divided into chunks. The process illustrated in FIG. 11 may be performed by the video codec 200. The process may start at step S1100 where an input cloud of p points and an ROI specified by a 3D bounding box is specified. The process may proceed to step S1102 where an ROI is divided into a number of chunks (C). An ROI may be divided when it is determined that the ROI does not fit into an HEVC tile.

The process proceeds to step S1104 where ROI patches for each chunk are generated and a variable c is set to 0. The ROI patches for each chunk may be performed in accordance with the process illustrated in Table 1. The process proceeds to step S1106 where the variable c is incremented by 1 and a variable k is set to 0. Steps S1108, S1110, and S1112 are performed in the same manner as steps S1008, S1010, and S1012, respectively. At step S1112, if k is equal to the number of patches for the c-th chunk, the process proceeds to step S1114, where it is determined if c is equal to the number of chunks (C). Accordingly, steps S1106-S1114 result in packing being performed for each ROI patch in each chunk.

If c is equal to the number of chunks (C), the process proceeds from step S1114 to step S116. Steps S1116, S1118, S1120, and S1122 are performed in the same manner as described for steps S1014, S1016, S1018, and S1020, respectively. The process illustrated in FIG. 11 ends after step S1122 is performed. Although the process illustrated in FIG. 11 is performed for a single ROI, when a point cloud has multiple ROIs, steps S1102-S1114 may be performed for each ROI included in the point cloud.

According to some embodiments, the tile map is not specified by the system. In this regard, the tile map is not fixed and may be designed flexibly. When the tile map is not specified by the system, the point cloud may still be separated into an ROI cloud and a non-ROI cloud as discussed above, where patch generation is performed independently for each separate cloud.

When there is a single ROI, the tile map may include one horizontal tile that encloses all the ROI patches, and another horizontal tile that encloses all the non-ROI patches. Each horizontal tile may span the width of an image, and be stacked on top of each other. In another example, when there is a single ROI, one tile may enclose all the ROI patches, and another tile may enclose all the non-ROI tiles, where the tiles are concatenated, and the length of the concatenated tiles spans the width of an image.

Figure 12:
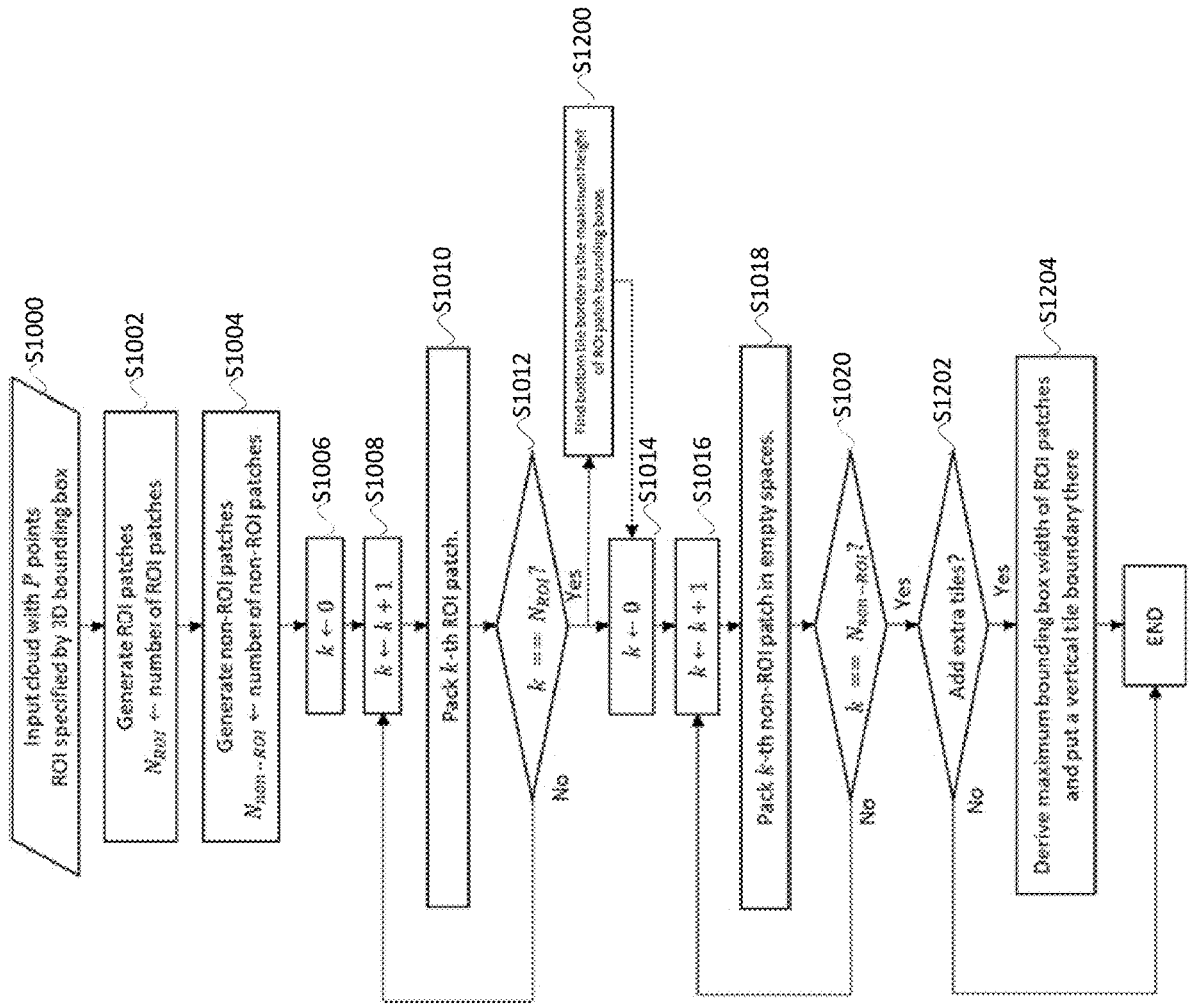
FIG. 12 show an exemplary process performed by a video codec in accordance with an embodiment.

FIG. 12 illustrates an embodiment in which ROI and non-ROI patches may be packed onto a 2D grid in which a tile map is not specified. As illustrated in FIG. 12, all the steps of the process illustrated in FIG. 10 are included. Furthermore, if at step S1012 it is determined that all the ROI patches have been packed (i.e., k==$N_{ROI}$), the process proceeds to step S1200 to set a bottom tile border as a maximum height of a ROI patch bounding boxes. In this regard, at step S1200, the size of the tile containing all the ROI patches may be set such that the tile encompasses all the ROI patches. Furthermore, if at step S1020 it is determined that all the non-ROI patches have been packed (i.e., $k==N_{non-ROI}$), the process proceeds to step S1202, where it is determined if extra tiles need to be added to 2D grid. For example, when the tile map is not specified, the tile map can be designed to efficiently use the available space. An efficient tile map design may be a 2×1 tile map where the top tile includes ROI patches and the bottom one has the non-ROI patches (e.g., design depicted in FIG. 12). To further benefit from the available design flexibility, the ROI patches may be packed into a tile with the smallest dimensions possible. In this scenario, if the ROI patches do not span the entire width of a canvas, a vertical line may be placed right after the right-most ROI patch to create one extra tile at the right, which is empty. A benefit of this approach is better compression efficiency since the texture/geometry images are background filled with redundant information, and background filling for that empty tile is avoided when each tile is encoded/decoded independently. If it is determined that extra tiles need to be added to the 2D grid, the process proceeds to step S1204 where a maximum bounding box width of the ROI patches is derived, and a vertical tile is placed at the derived bounding box. Although the process illustrated in FIG. 12 is performed for a single ROI, when a point cloud has multiple ROIs, steps S1102-S1012 including step S1200 may be performed for each ROI included in the point cloud.

Figure 13:
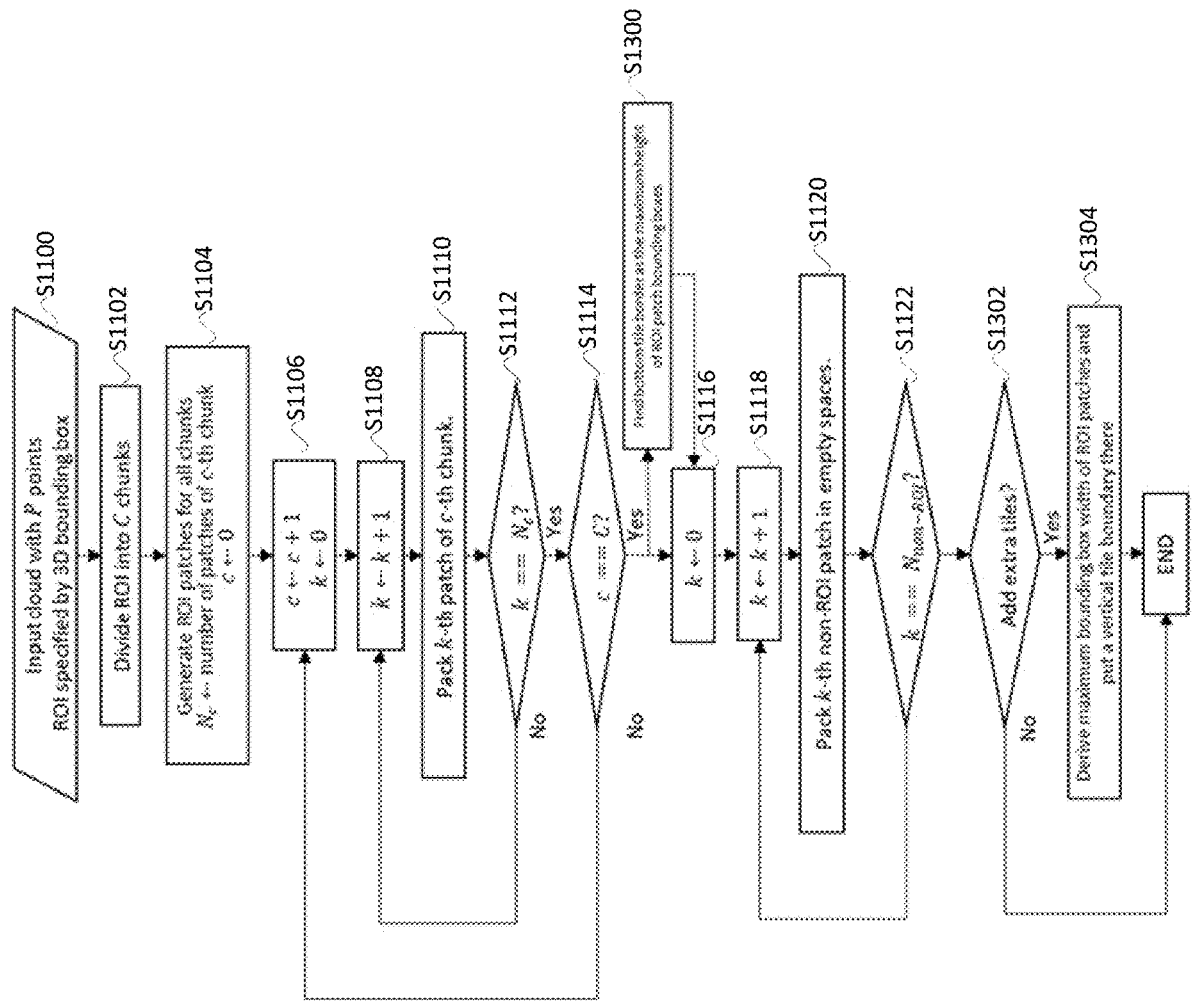
FIG. 13 show an exemplary process performed by a video codec in accordance with an embodiment.

FIG. 13 illustrates an embodiment in which ROI chunking is performed, and a tile map is not specified. As illustrated in FIG. 13, all the steps of the process illustrated in FIG. 11 are included. Furthermore, FIG. 13 includes steps S1300 and S1304, which are performed in the same manner as steps S1200 and S1204, respectively, as described above. Although the process illustrated in FIG. 11 is performed for a single ROI, when a point cloud has multiple ROIs, steps S1102-S1114 including step S1300 may be performed for each ROI included in the point cloud.

In some embodiments, to support a random-access feature for a single ROI, the indexes of ROI patches are sent to the decoder so that decoder decodes only the ROI patches to reconstruct the ROI cloud. Using the indexes of ROI patches, the decoder can determine the tiles filled by ROI patches and only decode those tiles. As alternative to the indexes, a flag is coded for each patch indicating whether the patch is a ROI-patch or a non-ROI patch. As another alternative, the indexes of ROI patches is changed to [0, number of ROI patches−1], where only a "number of ROI patches" is sent to the decoder, where the decoder knows that the first "number of ROI patches" are all ROI patches, and reconstructs the ROI cloud by decoding those patches.

According to some embodiments, a point cloud may include multiple ROIs. When multiple ROIs are included in a point cloud, multiple sets of ROI patches (e.g., one set of ROI patches per ROI cloud) may be created instead of creating only a single set of ROI patches. These sets may be packed one after another in accordance with the process illustrated in FIG. 10 when the tile map is specified, or the process illustrated in FIG. 12 when the tile map is not specified. Chunking may also be applied to each ROI cloud and packed in accordance with the process illustrated in FIG. 11 when the tile map is specified, or the process illustrated in FIG. 13 when the tile map is not specified.

Figure 14B:
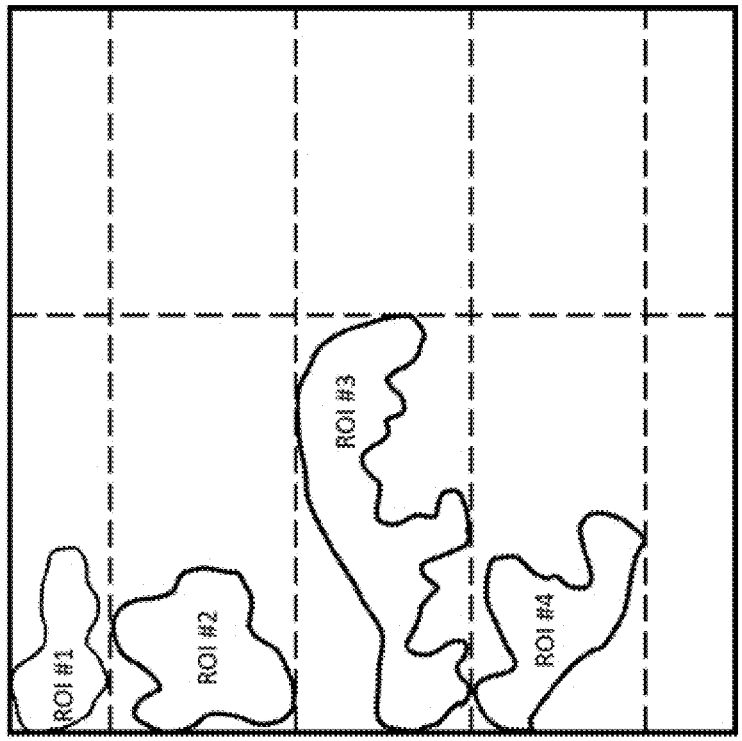
FIGS. 14A and 14B show exemplary patch packing with multiple ROIs in accordance with embodiments of the present disclosure.
Figure 14A:
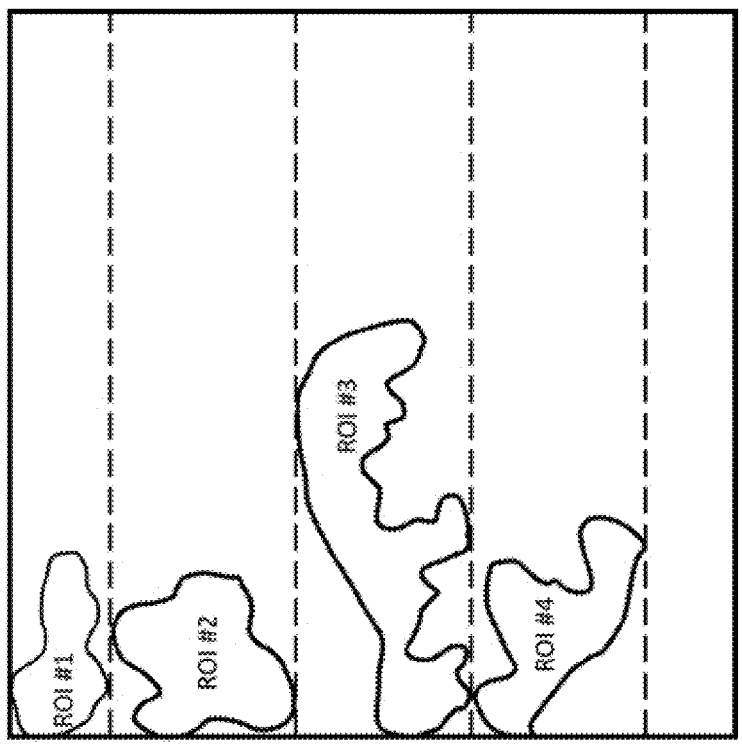

FIG. 14A illustrates an embodiment in which each ROI of multiple ROIs is placed in a tile that spans a width of an image. FIG. 14B illustrates an embodiment in which each ROI is placed in vertically stacked tiles and an empty space is divided into additional tiles. The tile boundaries in FIGS. 14A and 14B are depicted by dashed lines.

According to some embodiments, to support the random-access feature for multiple ROIs, the indexes of ROI patches are modified. Patches of ROI #1 may be indexed by [0, number of patches of ROI #1], patches of ROI #2 may be indexed by [number of patches of ROI #1, number of patches of ROI #1+number of patches of ROI #2-1], and so forth each additional ROI. The number of patches of each ROI may only be sent to the decoder, where the decoder can determine the patch indexes of a particular ROI and reconstruct that ROI accordingly.

In an example decoding process, an array of integers which indicate the number of patches per ROI may be specified as an array of integers as follows:

$$A=[n\_0, n\_1, n\_2, \ldots, n\_(R-1)],$$

where n_r indicates the number of patches of the r-th ROI.

The decoder knows that the patch indexes of the r-th ROI is in the range:

$$B=[n\_0+n\_1+\ldots+n\_(r-1)-1, n\_0+n\_1+\ldots+n\_r-1].$$

Thus, in some embodiments, to decode the r-th ROI, the decoder only needs to decode the patches with indexes given in the range B.

The techniques described above, can be implemented as computer software using computer-readable instructions and physically stored in one or more computer-readable media. For example, FIG. 15 shows a computer system (1500) suitable for implementing certain embodiments of the disclosed subject matter.

The computer software can be coded using any suitable machine code or computer language, that may be subject to assembly, compilation, linking, or like mechanisms to create code comprising instructions that can be executed directly, or through interpretation, micro-code execution, and the like, by one or more computer central processing units (CPUs), Graphics Processing Units (GPUs), and the like.

The instructions can be executed on various types of computers or components thereof, including, for example, personal computers, tablet computers, servers, smartphones, gaming devices, internet of things devices, and the like.

Figure 15:
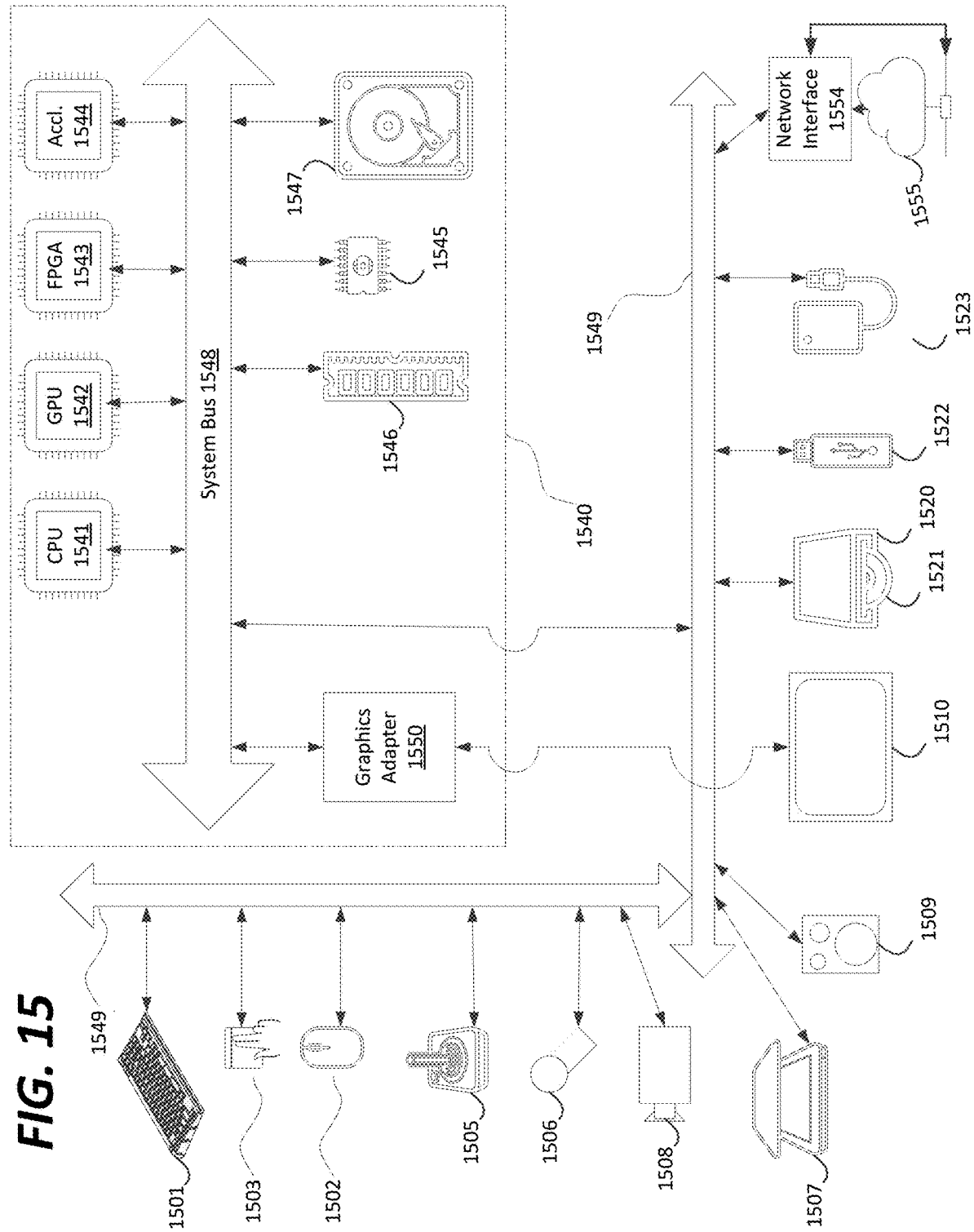
FIG. 15 is a schematic illustration of a computer system in accordance with an embodiment.

The components shown in FIG. 15 for computer system (1500) are exemplary in nature and are not intended to suggest any limitation as to the scope of use or functionality of the computer software implementing embodiments of the present disclosure. Neither should the configuration of components be interpreted as having any dependency or requirement relating to any one or combination of components illustrated in the exemplary embodiment of a computer system (1500).

Computer system (1500) may include certain human interface input devices. Such a human interface input device may be responsive to input by one or more human users through, for example, tactile input (such as: keystrokes, swipes, data glove movements), audio input (such as: voice, clapping), visual input (such as: gestures), olfactory input (not depicted). The human interface devices can also be used to capture certain media not necessarily directly related to conscious input by a human, such as audio (such as: speech, music, ambient sound), images (such as: scanned images, photographic images obtain from a still image camera), video (such as two-dimensional video, three-dimensional video including stereoscopic video).

Input human interface devices may include one or more of (only one of each depicted): keyboard (1501), mouse (1502), trackpad (1503), touch screen (1510), data-glove (not shown), joystick (1505), microphone (1506), scanner (1507), camera (1508).

Computer system (1500) may also include certain human interface output devices. Such human interface output devices may be stimulating the senses of one or more human users through, for example, tactile output, sound, light, and smell/taste. Such human interface output devices may include tactile output devices (for example tactile feedback by the touch-screen (1510), data-glove (not shown), or joystick (1505), but there can also be tactile feedback devices that do not serve as input devices), audio output devices (such as: speakers (1509), headphones (not depicted)), visual output devices (such as screens (1510) to include CRT screens, LCD screens, plasma screens, OLED screens, each with or without touch-screen input capability, each with or without tactile feedback capability—some of which may be capable to output two dimensional visual output or more than three dimensional output through means such as stereographic output; virtual-reality glasses (not depicted), holographic displays and smoke tanks (not depicted)), and printers (not depicted).

Computer system (1500) can also include human accessible storage devices and their associated media such as optical media including CD/DVD ROM/RW (1520) with CD/DVD or the like media (1521), thumb-drive (1522), removable hard drive or solid state drive (1523), legacy magnetic media such as tape and floppy disc (not depicted), specialized ROM/ASIC/PLD based devices such as security dongles (not depicted), and the like.

Those skilled in the art should also understand that term "computer readable media" as used in connection with the presently disclosed subject matter does not encompass transmission media, carrier waves, or other transitory signals.

Computer system (1500) can also include an interface to one or more communication networks. Networks can for example be wireless, wireline, optical. Networks can further be local, wide-area, metropolitan, vehicular and industrial, real-time, delay-tolerant, and so on. Examples of networks include local area networks such as Ethernet, wireless LANs, cellular networks to include GSM, 3G, 4G, 5G, LTE and the like, TV wireline or wireless wide area digital networks to include cable TV, satellite TV, and terrestrial broadcast TV, vehicular and industrial to include CANBus, and so forth. Certain networks commonly require external network interface adapters that attached to certain general purpose data ports or peripheral buses (1549) (such as, for example USB ports of the computer system (1500)); others are commonly integrated into the core of the computer system (1500) by attachment to a system bus as described below (for example Ethernet interface into a PC computer system or cellular network interface into a smartphone computer system). Using any of these networks, computer system (1500) can communicate with other entities. Such communication can be uni-directional, receive only (for example, broadcast TV), uni-directional send-only (for example CANbus to certain CANbus devices), or bi-directional, for example to other computer systems using local or wide area digital networks. Certain protocols and protocol stacks can be used on each of those networks and network interfaces as described above.

Aforementioned human interface devices, human-accessible storage devices, and network interfaces can be attached to a core (1540) of the computer system (1500).

The core (1540) can include one or more Central Processing Units (CPU) (1541), Graphics Processing Units (GPU) (1542), specialized programmable processing units in the form of Field Programmable Gate Areas (FPGA) (1543), hardware accelerators for certain tasks (1544), and so forth. These devices, along with Read-only memory (ROM) (1545), Random-access memory (1546), internal mass storage such as internal non-user accessible hard drives, SSDs, and the like (1547), may be connected through a system bus (1548). In some computer systems, the system bus (1548) can be accessible in the form of one or more physical plugs to enable extensions by additional CPUs, GPU, and the like. The peripheral devices can be attached either directly to the core's system bus (1548), or through a peripheral bus (1549). Architectures for a peripheral bus include PCI, USB, and the like.

CPUs (1541), GPUs (1542), FPGAs (1543), and accelerators (1544) can execute certain instructions that, in combination, can make up the aforementioned computer code. That computer code can be stored in ROM (1545) or RAM (1546). Transitional data can be also be stored in RAM (1546), whereas permanent data can be stored for example, in the internal mass storage (1547). Fast storage and retrieve to any of the memory devices can be enabled through the use of cache memory, that can be closely associated with one or more CPU (1541), GPU (1542), mass storage (1547), ROM (1545), RAM (1546), and the like.

The computer readable media can have computer code thereon for performing various computer-implemented operations. The media and computer code can be those specially designed and constructed for the purposes of the present disclosure, or they can be of the kind well known and available to those having skill in the computer software arts.

As an example and not by way of limitation, the computer system having architecture (1500), and specifically the core (1540) can provide functionality as a result of processor(s) (including CPUs, GPUs, FPGA, accelerators, and the like) executing software embodied in one or more tangible, computer-readable media. Such computer-readable media can be media associated with user-accessible mass storage as introduced above, as well as certain storage of the core (1540) that are of non-transitory nature, such as core-internal mass storage (1547) or ROM (1545). The software implementing various embodiments of the present disclosure can be stored in such devices and executed by core (1540). A computer-readable medium can include one or more memory devices or chips, according to particular needs. The software can cause the core (1540) and specifically the processors therein (including CPU, GPU, FPGA, and the like) to execute particular processes or particular parts of particular processes described herein, including defining data structures stored in RAM (1546) and modifying such data structures according to the processes defined by the software. In addition or as an alternative, the computer system can provide functionality as a result of logic hardwired or otherwise embodied in a circuit (for example: accelerator (1544)), which can operate in place of or together with software to execute particular processes or particular parts of particular processes described herein. Reference to software can encompass logic, and vice versa, where appropriate. Reference to a computer-readable media can encompass a circuit (such as an integrated circuit (IC)) storing software for execution, a circuit embodying logic for execution, or both, where appropriate. The present disclosure encompasses any suitable combination of hardware and software.

While this disclosure has described several exemplary embodiments, there are alterations, permutations, and various substitute equivalents, which fall within the scope of the disclosure. It will thus be appreciated that those skilled in the art will be able to devise numerous systems and methods which, although not explicitly shown or described herein, embody the principles of the disclosure and are thus within the spirit and scope thereof.

(1) A method performed by a video encoder includes receiving a data cloud including a plurality of data points representing a three-dimensional (3D) space; identifying each data point including a region-of-interest (ROI) associated with the data cloud; dividing the data cloud into a ROI cloud and one or more non-ROI clouds, the ROI cloud including each data point including the ROI; performing a patch generation process on the ROI cloud, the patch generation process including generating a ROI patch from each data point including the ROI; and performing a patch packing process on the ROI cloud, the patch packing process including: (i) mapping each ROI patch to a two dimensional (2D) map including a plurality of tiles arranged as a grid in the 2D map, (ii) determining whether at least two ROI patches from the plurality of ROI patches are located in more than one tile, and in response to the determination that at least two ROI patches are located in more than one tile, moving each of the ROI patches to a tile from the plurality of tiles.

(2) The method according to feature (1), further including performing the patch generation process on each non-ROI cloud including creating a non-ROI patch for each data point that does not include the ROI, and performing the patch packing process on each non-ROI cloud including mapping each of the non-ROI patches to one or more empty spaces in the two dimensional map that do not include the ROI patch.

(3) The method according to feature (1) or (2), in which the patch packing process on the ROI cloud and the patch packing process for each non-ROI cloud is performed in parallel.

(4) The method according to feature (2) or (3), further including compressing the tile including each of the ROI patches in accordance with a first compression ratio; and compressing each other tile from the plurality of tiles not including the ROI patches in accordance with a second compression ratio higher than the first compression ratio.

(5) The method according to any one of features (1)-(4), further including determining whether the ROI is larger than each tile included in the 2D map; and in response to the determination that the ROI is larger than each tile included in the 2D map, dividing the ROI cloud into one or more sub-ROI clouds, in which the patch generation process and the patch packing process is performed for each of the one or more sub-ROI clouds.

(6) The method according to feature (5), in which the patch packing process is performed on the one or more sub-ROI clouds in parallel.

(7) The method according to any one of features (1)-(6), the method further including determining whether a size of each tile in the 2D map is specified by the video encoder; and in response to the determination that the size of each tile in the 2D map is not specified by the video encoder, setting a height of the tile including the ROI patches such that the ROI patches are bounded by the tile including the ROI patches.

(8) The method according to feature (7), the method further including in response to the determination that the size of each tile in the 2D map is not specified by the video encoder, setting a width of the tile including the ROI patches such that the ROI patches are bounded by the tile including the ROI patches.

(9) The method according to any one of features (2)-(8), in which the data cloud includes a plurality of ROIs, the data cloud is divided into a plurality of ROI clouds with each ROI cloud corresponding to a respective ROI, and the patch generation process and the patch packing process is performed on each ROI cloud.

(10) The method according to feature (9), in which the patch packing process performed on each ROI cloud results in each ROI being mapped to a different tile in the 2D map.

(11) A video encoder includes processing circuitry configured to receive a data cloud including a plurality of data points representing a three-dimensional (3D) space, identify each data point including a region-of-interest (ROI) associated with the data cloud, divide the data cloud into a ROI cloud and one or more non-ROI clouds, the ROI cloud including each data point including the ROI, perform a patch generation process on the ROI cloud, the patch generation process including generating a ROI patch from each data point including the ROI; and perform a patch packing process on the ROI cloud, the patch packing process that includes: (i) map each ROI patch to a two dimensional (2D) map including a plurality of tiles arranged as a grid in the 2D map, (ii) determine whether at least two ROI patches from the plurality of ROI patches are located in more than one tile, and (iii) in response to the determination that at least two ROI patches are located in more than one tile, move each of the ROI patches to a tile from the plurality of tiles.

(12) The video encoder according to feature (11), in which the processing circuitry is further configured to: perform the patch generation process on each non-ROI cloud including creating a non-ROI patch for each data point that does not include the ROI, and perform the patch packing process on each non-ROI cloud including mapping each of the non-ROI patches to one or more empty spaces in the two dimensional map that do not include the ROI patch.

(13) The video encoder according to feature (11) or (12), in which the patch packing process on the ROI cloud and the patch packing process for each non-ROI cloud is performed in parallel.

(14) The video encoder according to feature (12) or (13), in which the processing circuitry is further configured to compress the tile including each of the ROI patches in accordance with a first compression ratio, and compress each other tile from the plurality of tiles not including the ROI patches in accordance with a second compression ratio higher than the first compression ratio.

(15) The video encoder according to any one of features (11)-(14), in which the processing circuitry is further configured to: determine whether the ROI is larger than each tile included in the 2D map; and in response to the determination that the ROI is larger than each tile included in the 2D map, divide the ROI cloud into one or more sub-ROI clouds, in which the patch generation process and the patch packing process is performed for each of the one or more sub-ROI clouds.

(16) The video encoder according to feature (15), in which the patch packing process is performed on the one or more sub-ROI clouds in parallel.

(17) The video encoder according to any one of features (11)-(16), in which the processing circuitry is further configured to determine whether a size of each tile in the 2D map is specified by the video encoder; and in response to the determination that the size of each tile in the 2D map is not specified by the video encoder, set a height of the tile including the ROI patches such that the ROI patches are bounded by the tile including the ROI patches.

(18) The video encoder according to feature (17), in which the processing circuitry is further configured to in response to the determination that the size of each tile in the 2D map is not specified by the video encoder, set a width of the tile including the ROI patches such that the ROI patches are bounded by the tile including the ROI patches.

(19) The video encoder according to any one of features (12)-(18), in which the data cloud includes a plurality of ROIs, the data cloud is divided into a plurality of ROI clouds with each ROI cloud corresponding to a respective ROI, and the patch generation process and the patch packing process is performed on each ROI cloud.

(20) A non-transitory computer readable medium having instructions stored therein, which when executed by a processor in a video encoder causes the processor to perform a method including receiving a data cloud including a plurality of data points representing a three-dimensional (3D) space; identifying each data point including a region-of-interest (ROI) associated with the data cloud; dividing the data cloud into a ROI cloud and one or more non-ROI clouds, the ROI cloud including each data point including the ROI; performing a patch generation process on the ROI cloud, the patch generation process including generating a ROI patch from each data point including the ROI; and performing a patch packing process on the ROI cloud, the patch packing process including: (i) mapping each ROI patch to a two dimensional (2D) map including a plurality of tiles arranged as a grid in the 2D map, (ii) determining whether at least two ROI patches from the plurality of ROI patches are located in more than one tile, and (iii) in response to the determination that at least two ROI patches are located in more than one tile, moving each of the ROI patches to a tile from the plurality of tiles.

What is claimed is:

1. A method performed by a video encoder comprising:
   receiving a data cloud including a plurality of data points representing a three-dimensional (3D) space;
   identifying each data point including a region-of-interest (ROI) associated with the data cloud;
   dividing the data cloud into a ROI cloud and one or more non-ROI clouds, the ROI cloud including each data point including the ROI;
   performing a patch generation process on the ROI cloud, the patch generation process including generating a ROI patch from each data point including the ROI; and
   performing a patch packing process on the ROI cloud, the patch packing process including:
      (i) mapping each ROI patch to a two dimensional (2D) map including a plurality of tiles arranged as a grid in the 2D map,
      (ii) determining whether at least two ROI patches from the plurality of ROI patches are located in more than one tile, and
      (iii) in response to the determination that at least two ROI patches are located in more than one tile, moving each of the ROI patches to a tile from the plurality of tiles.

2. The method according to claim 1, further comprising:
   performing the patch generation process on each non-ROI cloud including creating a non-ROI patch for each data point that does not include the ROI, and
   performing the patch packing process on each non-ROI cloud including mapping each of the non-ROI patches to one or more empty spaces in the two dimensional map that do not include the ROI patch.

3. The method according to claim 1, wherein the patch packing process on the ROI cloud and the patch packing process for each non-ROI cloud is performed in parallel.

4. The method according to claim 2, further comprising:
   compressing the tile including each of the ROI patches in accordance with a first compression ratio; and
   compressing each other tile from the plurality of tiles not including the ROI patches in accordance with a second compression ratio higher than the first compression ratio.

5. The method according to claim 1, further comprising:
   determining whether the ROI is larger than each tile included in the 2D map; and
   in response to the determination that the ROI is larger than each tile included in the 2D map, dividing the ROI cloud into one or more sub-ROI clouds,
   wherein the patch generation process and the patch packing process is performed for each of the one or more sub-ROI clouds.

6. The method according to claim 5, wherein the patch packing process is performed on the one or more sub-ROI clouds in parallel.

7. The method according to claim 1, the method further comprising:
   determining whether a size of each tile in the 2D map is specified by the video encoder; and
   in response to the determination that the size of each tile in the 2D map is not specified by the video encoder, setting a height of the tile including the ROI patches such that the ROI patches are bounded by the tile including the ROI patches.

8. The method according to claim 7, the method further comprising:
   in response to the determination that the size of each tile in the 2D map is not specified by the video encoder, setting a width of the tile including the ROI patches such that the ROI patches are bounded by the tile including the ROI patches.

9. The method according to claim 2, wherein the data cloud includes a plurality of ROIs, the data cloud is divided into a plurality of ROI clouds with each ROI cloud corresponding to a respective ROI, and the patch generation process and the patch packing process is performed on each ROI cloud.

10. The method according to claim 9, wherein the patch packing process performed on each ROI cloud results in each ROI being mapped to a different tile in the 2D map.

11. A video encoder comprising:
    processing circuitry configured to:
       receive a data cloud including a plurality of data points representing a three-dimensional (3D) space,
       identify each data point including a region-of-interest (ROI) associated with the data cloud,
       divide the data cloud into a ROI cloud and one or more non-ROI clouds, the ROI cloud including each data point including the ROI,
       perform a patch generation process on the ROI cloud, the patch generation process including generating a ROI patch from each data point including the ROI; and
       perform a patch packing process on the ROI cloud, the patch packing process that includes:

(i) map each ROI patch to a two dimensional (2D) map including a plurality of tiles arranged as a grid in the 2D map,
(ii) determine whether at least two ROI patches from the plurality of ROI patches are located in more than one tile, and
(iii) in response to the determination that at least two ROI patches are located in more than one tile, move each of the ROI patches to a tile from the plurality of tiles.

12. The video encoder according to claim 11, wherein the processing circuitry is further configured to:
perform the patch generation process on each non-ROI cloud including creating a non-ROI patch for each data point that does not include the ROI, and
perform the patch packing process on each non-ROI cloud including mapping each of the non-ROI patches to one or more empty spaces in the two dimensional map that do not include the ROI patch.

13. The video encoder according to claim 11, wherein the patch packing process on the ROI cloud and the patch packing process for each non-ROI cloud is performed in parallel.

14. The video encoder according to claim 12, wherein the processing circuitry is further configured to:
compress the tile including each of the ROI patches in accordance with a first compression ratio, and
compress each other tile from the plurality of tiles not including the ROI patches in accordance with a second compression ratio higher than the first compression ratio.

15. The video encoder according to claim 11, wherein the processing circuitry is further configured to:
determine whether the ROI is larger than each tile included in the 2D map; and
in response to the determination that the ROI is larger than each tile included in the 2D map, divide the ROI cloud into one or more sub-ROI clouds,
wherein the patch generation process and the patch packing process is performed for each of the one or more sub-ROI clouds.

16. The video encoder according to claim 15, wherein the patch packing process is performed on the one or more sub-ROI clouds in parallel.

17. The video encoder according to claim 11, wherein the processing circuitry is further configured to:
determine whether a size of each tile in the 2D map is specified by the video encoder; and
in response to the determination that the size of each tile in the 2D map is not specified by the video encoder, set a height of the tile including the ROI patches such that the ROI patches are bounded by the tile including the ROI patches.

18. The video encoder according to claim 17, wherein the processing circuitry is further configured to:
in response to the determination that the size of each tile in the 2D map is not specified by the video encoder, set a width of the tile including the ROI patches such that the ROI patches are bounded by the tile including the ROI patches.

19. The video encoder according to claim 12, wherein the data cloud includes a plurality of ROIs, the data cloud is divided into a plurality of ROI clouds with each ROI cloud corresponding to a respective ROI, and the patch generation process and the patch packing process is performed on each ROI cloud.

20. A non-transitory computer readable medium having instructions stored therein, which when executed by a processor in a video encoder causes the processor to perform a method comprising:
receiving a data cloud including a plurality of data points representing a three-dimensional (3D) space;
identifying each data point including a region-of-interest (ROI) associated with the data cloud;
dividing the data cloud into a ROI cloud and one or more non-ROI clouds, the ROI cloud including each data point including the ROI;
performing a patch generation process on the ROI cloud, the patch generation process including generating a ROI patch from each data point including the ROI; and
performing a patch packing process on the ROI cloud, the patch packing process including:
(i) mapping each ROI patch to a two dimensional (2D) map including a plurality of tiles arranged as a grid in the 2D map,
(ii) determining whether at least two ROI patches from the plurality of ROI patches are located in more than one tile, and
(iii) in response to the determination that at least two ROI patches are located in more than one tile, moving each of the ROI patches to a tile from the plurality of tiles.

* * * * *